United States Patent
Lai et al.

(10) Patent No.: US 9,952,520 B2
(45) Date of Patent: Apr. 24, 2018

(54) METHOD FOR SEMICONDUCTOR WAFER ALIGNMENT

(71) Applicant: Taiwan Semiconductor Manufacturing Co., Ltd, Hsinchu (TW)

(72) Inventors: Shing-Kuei Lai, Taichung (TW); Wei-Yueh Tseng, Hsinchu (TW); Hsiao-Yi Wang, Zhunan Township (TW); De-Fang Huang, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 15/460,607

(22) Filed: Mar. 16, 2017

(65) Prior Publication Data

US 2017/0192367 A1    Jul. 6, 2017

Related U.S. Application Data

(62) Division of application No. 14/297,889, filed on Jun. 6, 2014, now Pat. No. 9,601,436.

(51) Int. Cl.
*H01L 23/544* (2006.01)
*G03F 9/00* (2006.01)
*H01L 21/268* (2006.01)
*H01L 21/027* (2006.01)
*G03F 7/20* (2006.01)

(52) U.S. Cl.
CPC .......... *G03F 9/7088* (2013.01); *G03F 7/2004* (2013.01); *H01L 21/0274* (2013.01); *H01L 21/2686* (2013.01); *H01L 23/544* (2013.01); *H01L 2223/54426* (2013.01); *H01L 2223/54433* (2013.01)

(58) Field of Classification Search
None
See application file for complete search history.

(56) References Cited

U.S. PATENT DOCUMENTS

| | | |
|---|---|---|
| 4,461,567 A | 7/1984 | Mayer |
| 4,825,093 A | 4/1989 | Kirseko |
| 4,937,618 A * | 6/1990 | Ayata ................. G03F 7/70058 353/122 |
| 5,401,691 A | 3/1995 | Caldwell |
| 5,705,320 A | 1/1998 | Hsu |
| 6,043,864 A | 3/2000 | Lo |

(Continued)

*Primary Examiner* — Whitney T Moore
*Assistant Examiner* — Herve Assouman
(74) *Attorney, Agent, or Firm* — McClure, Qualey & Rodack, LLP

(57) ABSTRACT

A method for aligning a semiconductor wafer is provided. The method includes providing the semiconductor wafer having two alignment marks formed on an active region or on an edge region of the semiconductor wafer. An included angle that is formed between the two alignment marks in a circumferential direction of the semiconductor wafer is between about 12 degrees and about 36 degrees. The method further includes receiving the detection signal reflected from at least one of the first alignment mark and the second alignment mark. The method also includes determining a parameter by a control system based on the received detection signal and moving the semiconductor wafer according to the parameter.

20 Claims, 6 Drawing Sheets

(56) References Cited

U.S. PATENT DOCUMENTS

| | | | |
|---|---|---|---|
| 6,132,910 A * | 10/2000 | Kojima | ............... H01J 37/3045 |
| | | | 257/E23.179 |
| 6,303,899 B1 | 10/2001 | Johnson | |
| 6,368,761 B1 | 4/2002 | Chien | |
| 7,880,274 B2 | 2/2011 | Yang | |
| 8,324,743 B2 | 12/2012 | Yeh | |
| 2003/0003608 A1 | 1/2003 | Arikado | |
| 2009/0289378 A1 | 11/2009 | Hashii | |

* cited by examiner

METHOD FOR SEMICONDUCTOR WAFER ALIGNMENT

CROSS REFERENCE

This Application is a Divisional of U.S. application Ser. No. 14/297,889, filed on Jun. 6, 2014, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer. Generally, in a photolithography process, a light source is used to transfer a geometric pattern from a mask to a light-sensitive chemical resist material that is formed on the semiconductor wafer. As a result, an exposure pattern is generated in the resist material. A series of chemical treatments may then be used to etch or otherwise transfer the exposure pattern into one or more thin film layers positioned underneath the resist layer.

Although existing methods and devices for operating the processing steps have been generally adequate for their intended purposes, they have not been entirely satisfactory in all respects. Consequently, it would be desirable to provide a solution for the process control for semiconductor manufacturing operations

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
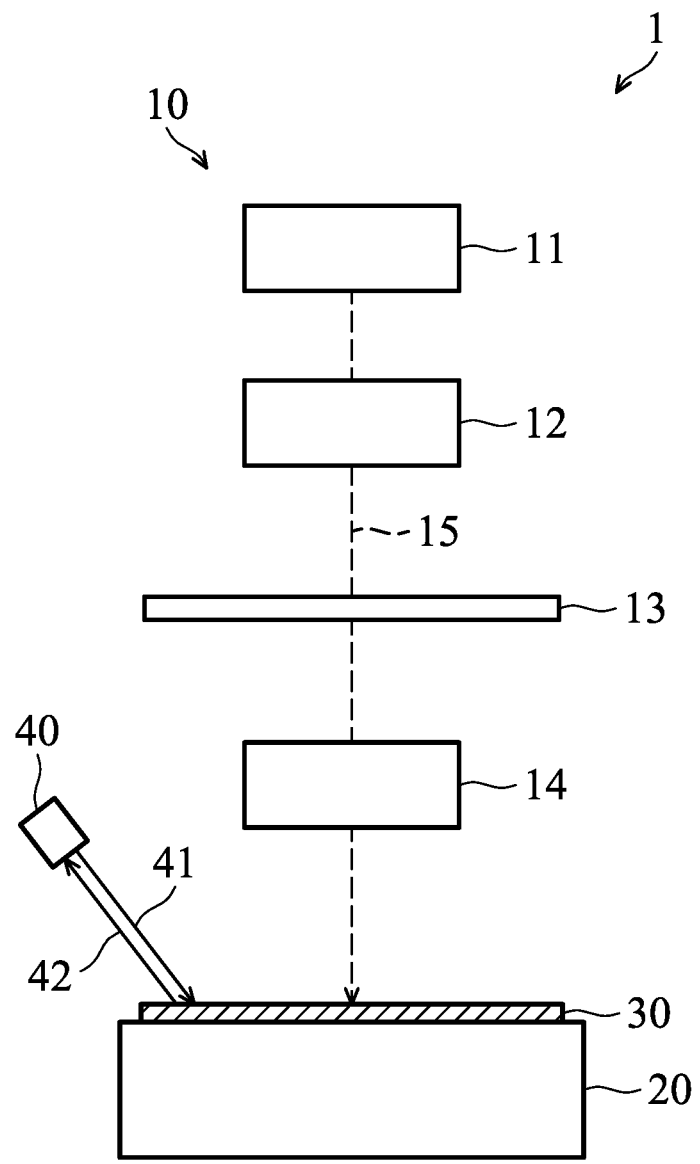
FIG. 1 shows a schematic view of a processing apparatus for processing a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Referring to FIG. 1, a schematic view of a processing apparatus 1 is shown, in accordance with some embodiments. The processing apparatus 1 is illustrated in a simplified form to generally describe components and systems that are well known, and more specifically to describe components and systems that are unique to the present embodiment. For example, the processing apparatus 1 includes an exposure module 10, a substrate stage 20, a semiconductor wafer 30, and a detection module 40.

In some embodiments, the exposure module 10 includes a radiation source 11, adjusting assembly 12, a mask 13, and an optical element assembly 14. When performing an exposure process, the radiation source 11 is configured to provide a radiation beam 15 (e.g., radiation energy) that is incident upon a semiconductor wafer 30. In some embodiments, the radiation beam 15 radiated by the radiation source 11 includes any suitable light source such as an ultra-violet (UV) source, a deep ultra-violent (DUV) source, or an extreme ultra-violet (EUV) source. The radiation source 11 may be a mercury lamp, a Krypton Fluoride (KrF) excimer laser, an Argon Fluoride (ArF) excimer laser, and/or other light sources.

In some embodiments, the mask 13 includes a transparent substrate including fused silica (SiO2), borosilicate glass, or soda-lime glass. In some embodiments, the mask 13 further includes an absorption layer formed on the transparent substrate. The absorption layer is patterned to have one or more openings. The radiation energy travels through the mask 13 via the openings and is completely or partially absorbed by the absorption layer. The absorption layer may be formed of chromium (Cr), iron oxide, or an inorganic film including, for example, MoSi, ZrSiO, SiN, and/or TiN, and/or other radiation absorbing materials known in the art. Therefore, the radiation beam passing the mask 13 includes a pattern in its cross-section. In some embodiments, the pattern is used to fabricate one or more circuit features or portions thereof on the semiconductor wafer 30. In some embodiments, the mask 13 is positioned on a holder (not shown in figures). The mask 13 is moved to facilitate a scan function of the exposure module 10.

In some embodiments, the adjusting assembly 12 is configured to define the area of the mask 13 to be illuminated during the exposure process by blocking portions of incident radiation. In some embodiments, the adjusting assembly 12 includes a reticle edge masking assembly (REMA) 12. The adjusting assembly 12 includes a number of blades which are orthogonally positioned and movable in order to define and opening for the radiation to pass.

In some embodiments, the optical element assembly 14 is configured to adjust the focal length of the radiation energy to be used to expose a single exposure field on the semiconductor wafer 30. Alternatively or additionally, the optical element assembly 14 includes a single lens or a number of lens elements configured to focus of the radiation energy in relation to the semiconductor wafer 30.

In some embodiments, the exposure module 10 is a stepper, a scanner, a step-and-scan system, an immersion lithography apparatus, and/or other apparatus capable of exposing a substrate to radiation. In some embodiments, the exposure process is performed by a scanner or step-and-scan system, instead of exposing the entire semiconductor wafer 30 at once.

In some embodiments, the substrate stage 20 is configured for holding, positioning, moving, and otherwise manipulating the semiconductor wafer 30. The substrate stage 20 is positioned relative to the exposure module 10 so as to allow the radiation energy from the exposure module 10 to be projected on the semiconductor wafer 30 arranged on the substrate stage 20. In some embodiments, the semiconductor wafer 30 is secured on a substrate stage 20 by a clamping mechanism, such as vacuum clamping or e-chuck clamping. In some embodiments, the substrate stage 20 is further designed and configured to be operable for translational and rotational motions. In some embodiments, the substrate stage 20 is further designed operably to tilt or dynamically change the tilt angle relative to an optical axis of the exposure module 10 such that the semiconductor wafer 30 is not perpendicular to the optical axis.

Figure 2:
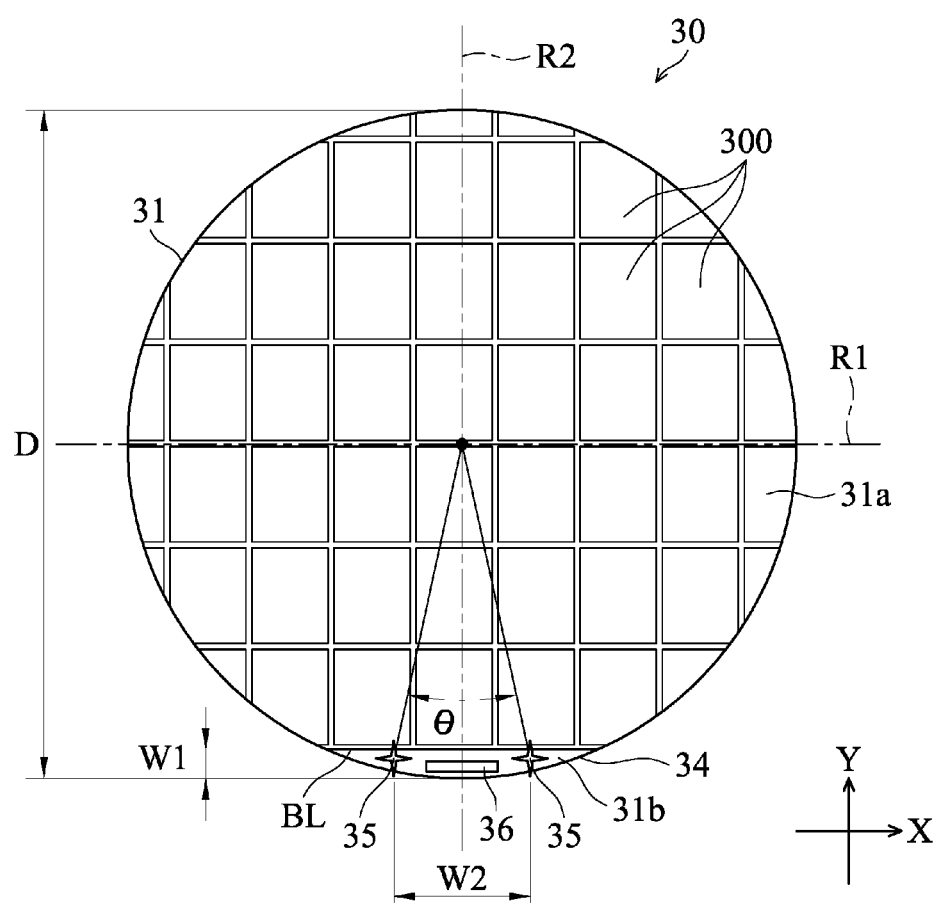
FIG. 2 shows a top view of a semiconductor wafer, in accordance with some embodiments.

Referring to FIG. 2, in some embodiments, the semiconductor wafer 30 includes a base layer 31. The base layer 31 includes silicon, germanium, diamond, and/or a compound of semiconductor materials. As shown in FIG. 2, a traversal line R1 and a vertical line R2 are indicated for the purpose of description. The traversal line R1 passes through the center of the semiconductor wafer 30 and extends in the X-axis direction. The vertical line R2 passes through the center of the semiconductor wafer 30 and extends in a direction along the Y-axis. The traversal line R1 is perpendicular to the vertical line R2.

In some embodiments, the base layer 31 has an active region 31a and an edge region 31b. The active region 31a and the edge region 31b are separated from each other by a boundary line BL. The boundary line BL is away from a circumference 34 of the edge region 31b by a distance W1 in a direction parallel to the Y-axis. The ratio between the distance W1 and the diameter D of the base layer 31 of the semiconductor wafer 30 is at about 0.035 to about 0.055. For example, for a semiconductor wafer 30 with a diameter of 200 mm, the distance W1 is in a range of about 7 mm to 11 mm.

In some embodiments, a wafer identification 36 and one or more alignment marks (such as two alignment marks 35) are formed on the edge region 31b. In some embodiments, the wafer identification 36 is used for identifying the semiconductor wafer 30 and is arranged on the central area of the edge region 31b. In some embodiments, the wafer identification 36 is positioned relative to the vertical line R2. Individual wafers are identified during manufacture by reading the wafer identification 36. For example, an identifier (not shown in figures) scans the wafer identification 36 and identifies the semiconductor wafer 30 according to the information shown by the wafer identification 36. In some embodiments, the wafer identification 36 has 11 characters and is about 13 mm in length. The wafer identification 36 is etched into the semiconductor wafer 30 by a laser beam.

The alignment marks 35 are used for performing an alignment process on the semiconductor wafer 30. In some embodiments, the two alignment marks 35 are located at two sides of the wafer identification 36. Namely, the two alignment marks 35 are located at two sides of the vertical line R2. In some embodiments, the two alignment marks 35 have a depth from about 1150 Å to about 1250 Å. The alignment marks 35 have a width from about 7.8 to 8.2 μm. However, the dimension of the two alignment marks 35 should not be limited thereto. The alignment marks 35 can be any convenient shape and dimensions which are able to reflect a detection signal from the detection module 40.

Figure 3:
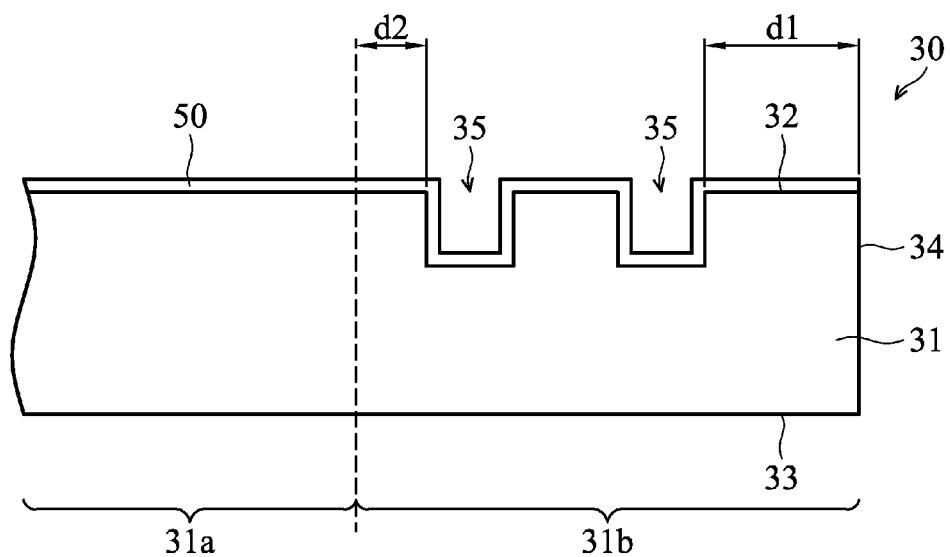
FIG. 3 shows a partial cross-sectional view of a semiconductor wafer, in accordance with some embodiments.

As shown in FIG. 3, in some embodiments, each of the alignment marks 35 is spaced from the boundary line BL defined between the active region 31a and the edge region 31b by a distance d2 of about 2 mm to about 6 mm. As a result, the photoresist material 50 disposed on the alignment marks 35 is prevented from being exposed while performing the exposure process in the active region 31a. In some embodiments, each of the alignment marks 35 is spaced from the circumference 34 of the edge region 31b by a distance d1 of about 3 mm to about 6 mm in a direction parallel to the Y-axis. As a result, damage to the alignment marks 35 is prevented should a collision of the semiconductor wafer 30 occur.

Referring again to FIG. 2, for the purpose of illustration, the alignment mark 35 positioned on the right hand side of the vertical line R2 is referred to as the first alignment mark 35, and the alignment mark 35 positioned on the left hand side of the vertical line R2 is referred to as the second alignment mark 35 in the following descriptions. In some embodiments, the first alignment mark 35 and the second alignment mark 35 are separated from each other by a distance W2 of about 20 mm to about 50 mm. In some embodiments, an included angle that is formed between the first alignment mark 35 and the second alignment mark 35 in a circumferential direction of the semiconductor wafer 30 is between about 12 degrees and about 36 degrees. It should be appreciated that while the semiconductor wafer 30 includes two alignment marks 35, the present disclosure should not be limited thereto. In some other embodiments, the semiconductor wafer 30 has one alignment mark 35 positioned in the edge region 31b. In still some other embodiments, the semiconductor wafer 30 has three or more alignment marks 35. Some of the alignment marks 35 are positioned in the edge region 31b, and some of the alignment marks 35 are positioned in the active region 31a.

In some embodiments, the active region 31a of the semiconductor wafer 30 includes a matrix (e.g., columns and rows) of adjacent exposure fields 300. Each of the exposure fields 300 includes one or more dies and/or portions thereof. In addition, each of the exposure fields 300 corresponds to an area that is irradiated in a single exposure by the exposure module 10. In some embodiments, the exposure fields 300 are overlapped on adjacent exposure fields 300 (e.g., a region of the semiconductor wafer 30 may be included in more than one exposure field). The exposure module 10 applies a radiation beam including a pattern in the beam's cross-section onto the surface of the semiconductor wafer 30 and in particular onto the surface of the semiconductor wafer 30 in an exposure field 300 coated with a photosensitive material. In some embodiments, each of the exposure fields 300 has a rectangular shape, and the short sides thereof extend along a direction parallel to the X-axis, and the long sides thereof extend along a direction parallel to the Y-axis. In some embodiments, each row of the exposure fields 300 is arranged along a direction that is parallel to the boundary line BL.

Figure 4:
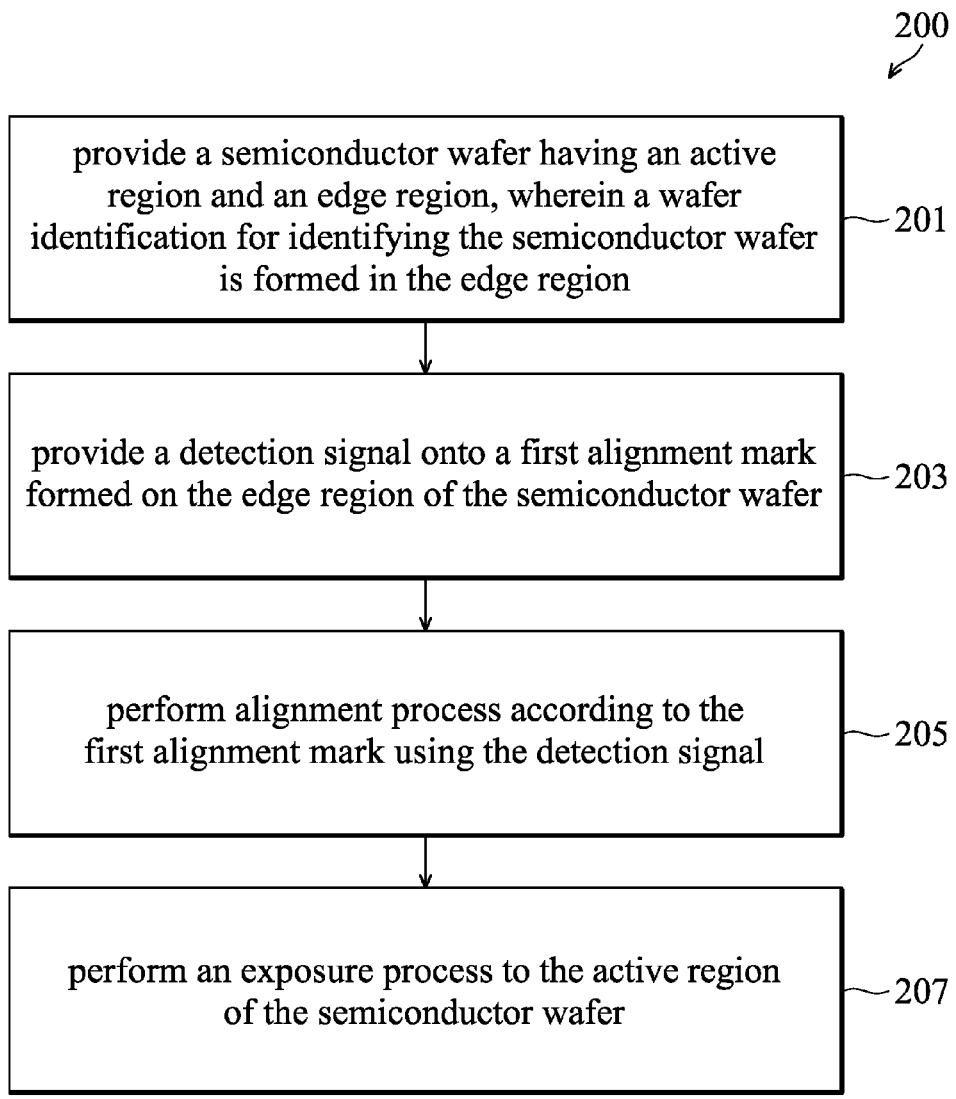
FIG. 4 shows a flow chart illustrating a method for processing a semiconductor wafer, in accordance with some embodiments.

Referring to FIG. 4, a flow chart illustrating a method 200 for processing a semiconductor wafer (such as semiconductor wafer 30) by a processing apparatus (such as processing apparatus 1) is shown, in accordance with some embodiments. The method 200 begins with operation 201, in which the semiconductor wafer 30 is provided. In some embodiments, prior to the exposure-process step, the semiconductor wafer 30 goes through various other fabrication processes including forming a layer of photosensitive material on the semiconductor wafer 30. The photosensitive material, for example, is a chemical amplification resist (CAR). The forming of the photoresist layer on the substrate may be performed by a spin-on process, a deposition process, and/or other processes for forming a layer known in the art. Afterwards, the semiconductor wafer 30 is soft baked to evaporate solvents. The semiconductor wafer 30 may then be transferred to the exposure module 10 and in particular, to the substrate stage 20. In some embodiments, prior to the exposure process step, a number of semiconductor devices (such as CMOS transistors) are formed on the active region 31a of the semiconductor wafer 30. In some embodiments, the semiconductor wafer 30 includes a number of features formed thereon including one or more patterned layers.

The method 200 continues with operation 203, in which a detection signal 41 is provided by the detecting module 40 (FIG. 1) onto alignment marks 35 of the semiconductor wafer 30. In addition, the detecting module 40 receives the reflected signal 42 that is reflected by the alignment marks 35 formed on the semiconductor wafer 30. As a result, the position of each alignment mark 35 is detected by the detecting module 40. In some embodiments, all of the alignment marks 35 are detected by the detecting module 40 at the same time. In some other embodiments, the detecting module 40 sequentially detects the position of each single alignment mark 35. In some embodiments, the detection signal 41 includes ultraviolet, visible, infrared radiation, or any combination thereof.

The method 200 continues with operation 205, in which an alignment process according to the alignment marks 35 using the detection signal 41 is performed. In some embodiments, after the detecting module 40 receives the reflected signal 42, the detecting module 40 produces an electrical signal to a control system (not shown in figures). Afterwards, the control system analyzes the electronic signal and controls the substrate stage 20 to adjust the position or orientation of the semiconductor wafer 30 so as to finish the alignment process. In some embodiments, in the alignment process is performed according to the first and the second alignment marks 35 using the detection signal. Specifically, the detecting module 40 receives the reflected signal 42 from the first and the second alignment marks 35. In addition, the control system analyzes all of the signals and controls the substrate stage 20 to adjust the position or orientation of the semiconductor wafer 30.

The method 200 continues with operation 207, in which an exposure process is performed on the active region 31a of the semiconductor wafer 30. In some embodiments, the semiconductor wafer 30 is moved by the substrate stage 20. The substrate stage 20 is configured to move in a direction along the X-axis or the Y-axis. As a result, all of the exposure fields 300 of the exposure fields 300 are exposed by the radiation beam 15.

Figure 5:
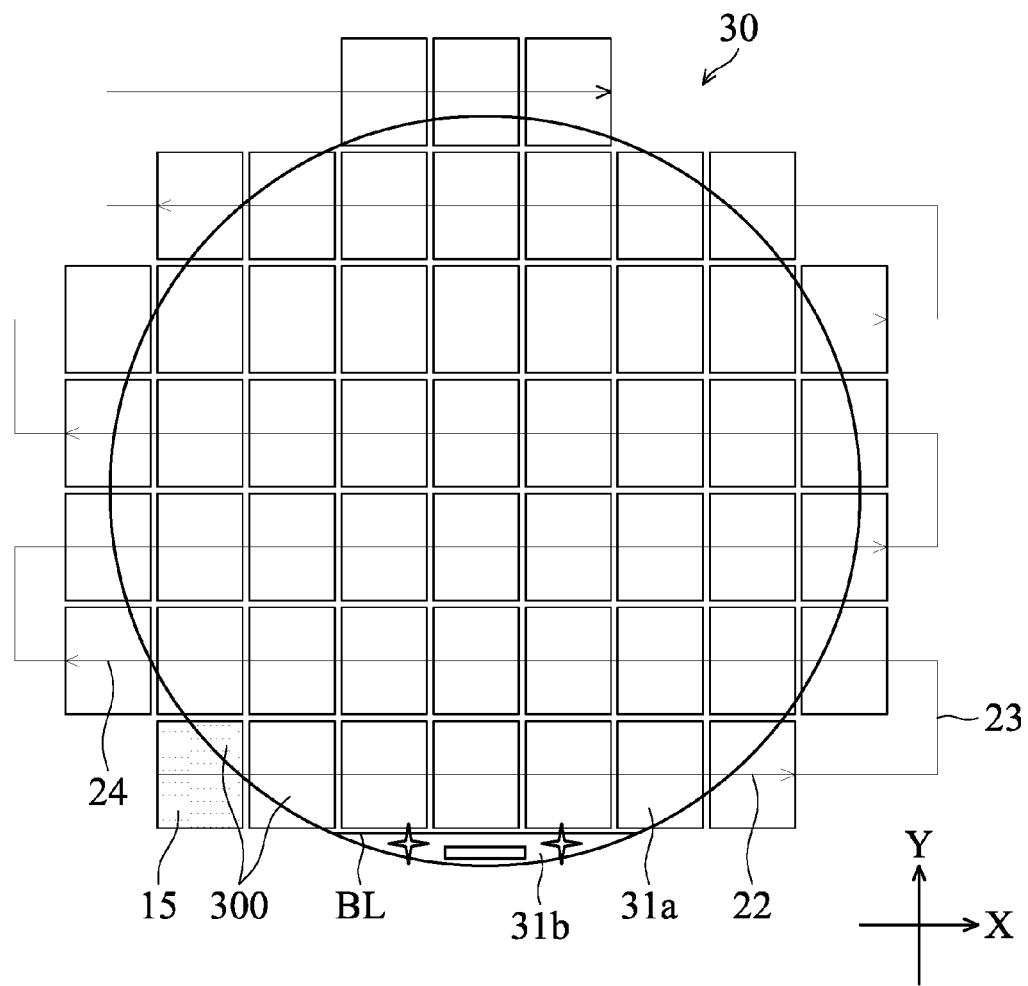
FIG. 5 shows a top view of a semiconductor wafer being exposed by radiation energy, in accordance with some embodiments.

For example, as shown in FIG. 5, the exposure field 300 is exposed by the radiation beam 15 from the exposure module 10 and a desired pattern is formed on the corresponding area of the semiconductor wafer 30. Afterwards, the semiconductor wafer 30 is moved in a direction 22 along a direction parallel to the X-axis by the substrate stage 20 (FIG. 1), and the operation is repeated at the adjacent exposure field 300, and so forth. When the exposure field 300 at the edge of the semiconductor wafer 30 is exposed by the radiation beam 15, the substrate stage 20 continues to move such that the radiation beam 15 goes beyond the edge a sufficient distance to facilitate a change in a direction 23 along the Y-axis. The semiconductor wafer 30 is then moved in the opposite direction 24 along the X-axis until the radiation beam 15 again reaches the first exposure field 300 at the edge of the semiconductor wafer 30. The semiconductor wafer 30 continues to move such that the radiation beam 15 goes beyond the edge of the semiconductor wafer 30 to again facilitate a change in the direction along the Y-axis.

In some embodiments, in the operation of performing the exposure process, each of the exposure fields 300 is exposed for the same duration. In some embodiments, in the operation of performing the exposure process, each of the exposure fields is exposed by the same amount of radiation energy. In some embodiments, the exposure process is not performed on the edge region 31b of the semiconductor wafer 30. Therefore, no pattern is formed on the edge region 31b of the semiconductor wafer 30.

After all of the exposure fields 300 in the active region 31a of semiconductor wafer 30 are exposed by the radiation beam 15, the desired patterns are formed on the surface of the semiconductor wafer 30 corresponding to the active region 31a. In some embodiments, after the exposure process, the semiconductor wafer 30 is subjected to further photolithography processing, such as a post-exposure bake providing for polymer dissolution and subsequent development of the exposed pattern. The pattern is used to form one or more features on the substrate such as, a gate feature, a source feature, a drain feature, an interconnect feature, an isolation feature, and/or other integrated circuit features. Such features are formed using conventional fabrication method, such as ion implantation, diffusion, deposition, plating, etching, chemical mechanical polishing, oxidation and/or other processes known in the art. In some embodiments, the semiconductor wafer 30 is processed through a number of photolithography processes in forming a device on the semiconductor wafer 30, during which the exposure module is performs an exposure process on the semiconductor wafer 30 a number of times.

Figure 6:
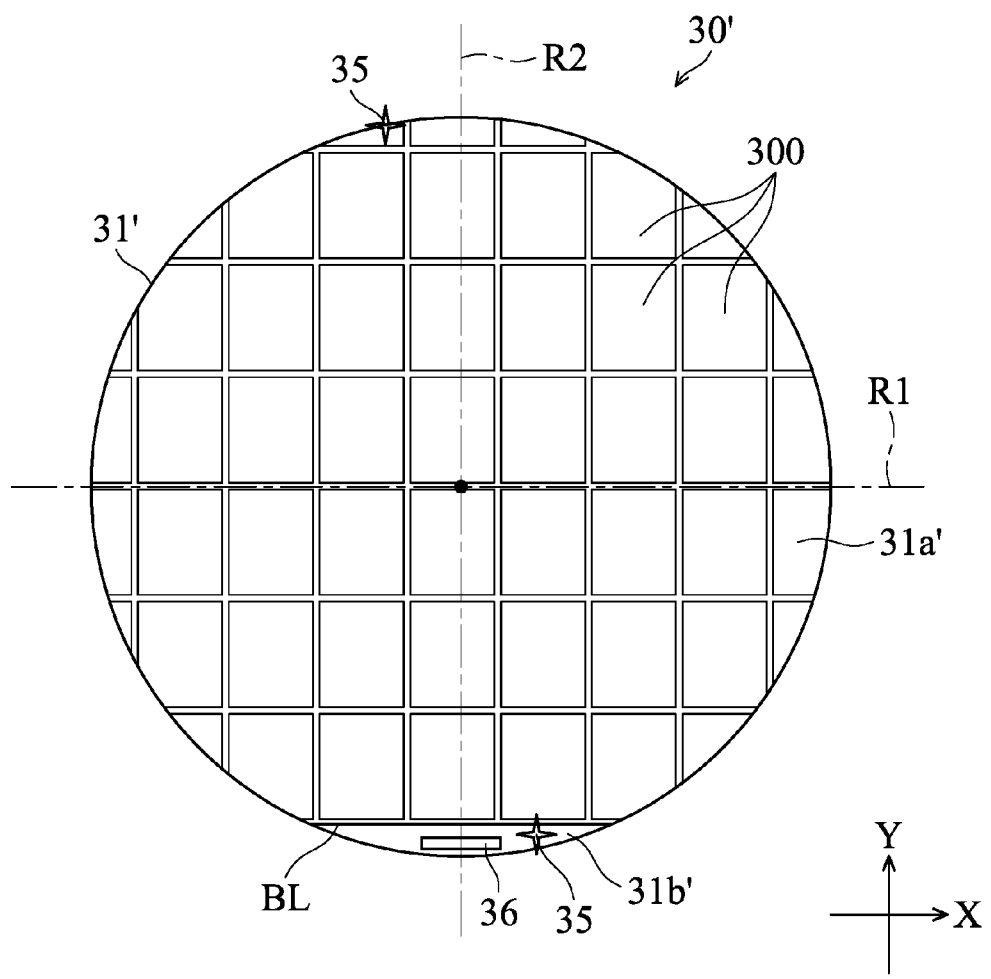
FIG. 6 shows a top view of a semiconductor wafer, in accordance with some embodiments.

Referring to FIG. 6, in some embodiments, one or more alignment marks 35 are formed on the active region 31a' of the semiconductor wafer 30', and one or more alignment marks 35 are formed on the edge region 31b' of the semiconductor wafer 30'. In some embodiments, to perform the exposure process on the exposure field 300 where the alignment mark 35 is located, the amount of the radiation is adjusted by the exposure module 10. For example, the adjusting assembly 12 of the exposure module 10 is driven to decrease the amount of radiation beam illuminated on the mask 13. Therefore, a portion of the corresponding exposure field 300 is not exposed by the radiation beam 15, and the exposure of the photoresist layer formed on the alignment marks 35 is avoided.

Embodiments of method for semiconductor wafer alignment are provided. One or more alignment marks used for the alignment process are formed on an edge region of a semiconductor wafer. Since the number of alignment marks formed in an active region where semiconductor devices are formed has decreased, the gross dies of the semiconductor wafer are increased. In addition, because the time needed to adjust the exposure amount of the radiation beam is reduced or eliminated, the processing time is reduced, and productivity is therefore increased.

In accordance with some embodiments, a method for photolithography in semiconductor device manufacturing is provided. The method includes providing a semiconductor wafer having an active region and an edge region separated from the active region by a boundary line that is spaced from the outer periphery of the edge region by a predetermined distance. The outer boundary of the semiconductor wafer is defined by the outer periphery of the edge region and the outer periphery of the active region. The method also includes providing a detection signal onto at least one of a first alignment mark and a second alignment mark formed on the active region or on the edge region of the semiconductor wafer. An included angle that is formed between the first alignment mark and the second alignment mark in a circumferential direction of the semiconductor wafer is between about 12 degrees and about 36 degrees. The method further includes receiving the detection signal reflected from at least one of the first alignment mark and the second alignment mark to perform an alignment process. In addition, the method includes performing an exposure process to the active region of the semiconductor wafer.

In accordance with some embodiments, a method for aligning a semiconductor wafer is provided. The method includes providing the semiconductor wafer having an active region and an edge region separated from the active region by a boundary line that is spaced from the outer periphery of the edge region by a predetermined distance. The outer boundary of the semiconductor wafer is defined by the outer periphery of the edge region and the outer periphery of the active region. The method also includes providing a detection signal onto at least one of a first alignment mark and a second alignment mark formed on the active region or on the edge region of the semiconductor wafer. An included angle that is formed between the first alignment mark and the second alignment mark in a circumferential direction of the semiconductor wafer is between about 12 degrees and about 36 degrees. The method further includes receiving the detection signal reflected from at least one of the first alignment mark and the second alignment mark. In addition, the method includes determining a parameter by a control system based on the received detection signal and moving the semiconductor wafer according to the parameter.

In accordance with some embodiments, a method for processing a semiconductor wafer is provided. The method includes providing the semiconductor wafer having an active region and an edge region separated from the active region by a boundary line that is spaced from the outer periphery of the edge region by a predetermined distance. The outer boundary of the semiconductor wafer is defined by the outer periphery of the edge region and the outer periphery of the active region. The method also includes providing a detection signal onto at least one of a first alignment mark and a second alignment mark formed on the active region or on the edge region of the semiconductor wafer. An included angle that is formed between the first alignment mark and the second alignment mark in a circumferential direction of the semiconductor wafer is between about 12 degrees and about 36 degrees. The method further includes receiving the detection signal reflected from at least one of the first alignment mark and the second alignment mark to perform an alignment process. In addition, the method includes forming semiconductor device on the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for photolithography in semiconductor device manufacturing, comprising:
    providing a semiconductor wafer having an active region and an edge region separated from the active region by a boundary line that is spaced from an outer periphery of the edge region by a predetermined distance, wherein an outer boundary of the semiconductor wafer is defined by an outer periphery of the edge region and an outer periphery of the active region;
    providing a detection signal onto at least one of a first alignment mark and a second alignment mark formed on the active region or on the edge region of the semiconductor wafer, wherein an included angle that is formed between the first alignment mark and the second alignment mark in a circumferential direction of the semiconductor wafer is between about 12 degrees and about 36 degrees;
    receiving the detection signal reflected from the at least one of the first alignment mark and the second alignment mark to perform an alignment process; and
    performing an exposure process to the active region of the semiconductor wafer.

2. The method as claimed in claim 1, wherein the boundary line extends in a direction that is perpendicular to a vertical line passing through a center of the semiconductor wafer, and the first and the second alignment marks are located at two sides of the vertical line.

3. The method as claimed in claim 1, wherein a plurality of exposure fields are defined in the active region, and in the operation of performing the exposure process, each of the exposure fields is exposed for a same duration.

4. The method as claimed in claim 1, wherein a plurality of exposure fields are defined in the active region, and in the operation of performing the exposure process, each of the exposure fields is exposed by a same amount of radiation energy.

5. The method as claimed in claim 1, wherein the exposure process comprises producing a radiation beam by a radiation source, and the radiation source comprises an ultra-violet (UV) source, a deep ultra-violent (DUV) source, or an extreme ultra-violet (EUV) source.

6. The method as claimed in claim 1, wherein the detection signal is provided onto the first alignment mark and the second alignment mark at a same time.

7. The method as claimed in claim 1, wherein the detection signal is provided onto the first alignment mark and the second alignment mark sequentially.

8. The method as claimed in claim 1, wherein the detection signal comprises ultraviolet, visible, or infrared radiation, or any combination thereof.

9. A method for aligning a semiconductor wafer, comprising:
providing the semiconductor wafer having an active region and an edge region separated from the active region by a boundary line that is spaced from an outer periphery of the edge region by a predetermined distance, wherein an outer boundary of the semiconductor wafer is defined by an outer periphery of the edge region and an outer periphery of the active region;
providing a detection signal onto at least one of a first alignment mark and a second alignment mark formed on the active region or on the edge region of the semiconductor wafer, wherein an included angle that is formed between the first alignment mark and the second alignment mark in a circumferential direction of the semiconductor wafer is between about 12 degrees and about 36 degrees;
receiving the detection signal reflected from at least one of the first alignment mark and the second alignment mark;
determining a parameter by a control system based on the received detection signal; and
moving the semiconductor wafer according to the parameter.

10. The method as claimed in claim 9, wherein the boundary line extends in a direction that is perpendicular to a vertical line passing through a center of the semiconductor wafer, and the first and the second alignment marks are located at two sides of the vertical line.

11. The method as claimed in claim 9, wherein the detection signal is provided onto the first alignment mark and the second alignment mark at a same time.

12. The method as claimed in claim 9, wherein the detection signal is provided onto the first alignment mark and the second alignment mark sequentially.

13. The method as claimed in claim 9, wherein the detection signal comprises ultraviolet, visible, or infrared radiation, or any combination thereof.

14. The method as claimed in claim 9, wherein the movement of the semiconductor wafer comprises adjusting the position or orientation of the semiconductor wafer.

15. A method for processing a semiconductor wafer, comprising:
providing the semiconductor wafer having an active region and an edge region separated from the active region by a boundary line that is spaced from an outer periphery of the edge region, wherein an outer boundary of the semiconductor wafer is defined by an outer periphery of the edge region and an outer periphery of the active region;
providing a detection signal onto a first alignment mark and a second alignment mark formed on the active region or on the edge region of the semiconductor wafer, wherein an included angle that is formed between the first alignment mark and the second alignment mark in a circumferential direction of the semiconductor wafer is between about 12 degrees and about 36 degrees;
adjusting an position or an orientation of the semiconductor wafer according to the detection signal reflected from the first alignment mark and the second alignment mark; and
forming a semiconductor device on the active region.

16. The method as claimed in claim 15, wherein the boundary line extends in a direction that is perpendicular to a vertical line passing through a center of the semiconductor wafer, and the first and the second alignment marks are located at two sides of the vertical line.

17. The method as claimed in claim 15, wherein the detection signal is provided onto the first alignment mark and the second alignment mark at a same time.

18. The method as claimed in claim 15, wherein the detection signal is provided onto the first alignment mark and the second alignment mark sequentially.

19. The method as claimed in claim 15, wherein the detection signal comprises ultraviolet, visible, or infrared radiation, or any combination thereof.

20. The method as claimed in claim 15, wherein the process for forming semiconductor device comprises a photolithography process.

* * * * *